(12) United States Patent
Uno

(10) Patent No.: US 11,595,044 B2
(45) Date of Patent: Feb. 28, 2023

(54) INPUT CIRCUIT

(71) Applicant: SOCIONEXT INC., Kanagawa (JP)

(72) Inventor: Osamu Uno, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/244,821

(22) Filed: Apr. 29, 2021

(65) Prior Publication Data

US 2021/0344345 A1 Nov. 4, 2021

(30) Foreign Application Priority Data

Apr. 30, 2020 (WO) .................. PCT/JP2020/018304

(51) Int. Cl.
*H03K 19/094* (2006.01)
*H03K 17/687* (2006.01)
*H03K 19/0185* (2006.01)

(52) U.S. Cl.
CPC ......... *H03K 19/094* (2013.01); *H03K 17/687* (2013.01); *H03K 19/018507* (2013.01)

(58) Field of Classification Search
CPC ......... H03K 17/687; H03K 19/018507; H03K 19/094
See application file for complete search history.

(56) References Cited

U.S. PATENT DOCUMENTS 5,039,882 A * 8/1991 Arakawa ................. G11C 16/12
365/230.06
5,160,860 A * 11/1992 Runaldue ............. H03K 17/063
326/98
5,495,195 A * 2/1996 Fontana ........... H03K 19/01721
327/108
6,031,393 A * 2/2000 Wayner ............ H03K 19/00315
326/83
6,031,403 A 2/2000 Gersbach
(Continued)

FOREIGN PATENT DOCUMENTS

JP H02-244817 A 9/1990
JP H05-291939 A 11/1993
(Continued)

OTHER PUBLICATIONS

International Search Report and Written Opinion issued in International Patent Application No. PCT/JP2020/018304, dated Jul. 7, 2020; with partial English translation.
(Continued)

*Primary Examiner* — Kurtis R Bahr
(74) *Attorney, Agent, or Firm* — McDermott Will & Emery LLP

(57) ABSTRACT

An input circuit includes an input buffer circuit using a first node as an input and a second node as an output, an N-type transistor having a source coupled to the input terminal, a drain coupled to the first node, and a gate coupled to a power supply, and a pull-up circuit provided between the first node and the power supply. The pull-up circuit is configured to make the power supply and the first node conducive with each other for a predetermined period when the input signal transitions from low to high and not to make the power supply and the first node conductive with each other when the input signal transitions from high to low.

16 Claims, 15 Drawing Sheets

(56) References Cited

U.S. PATENT DOCUMENTS

| | | | | |
|---|---|---|---|---|
| 8,593,203 B2* | 11/2013 | Shankar | ......... | H03K 19/018507 |
| | | | | 326/62 |
| 2006/0220686 A1* | 10/2006 | Suzuki | ............. | H03K 19/00315 |
| | | | | 326/83 |
| 2007/0210838 A1* | 9/2007 | Gupta | ............ | H03K 19/018521 |
| | | | | 327/112 |
| 2011/0062990 A1* | 3/2011 | Yamada | ........... | H03K 3/356182 |
| | | | | 326/62 |
| 2012/0230111 A1 | 9/2012 | Tanzawa | | |
| 2018/0006650 A1 | 1/2018 | Narayanan et al. | | |
| 2018/0006651 A1 | 1/2018 | Narayanan et al. | | |

FOREIGN PATENT DOCUMENTS

| | | |
|---|---|---|
| JP | H10-178336 A | 6/1998 |
| JP | 3092636 B2 | 9/2000 |
| JP | 2011-061696 A | 3/2011 |
| JP | 2017-153095 A | 8/2017 |
| JP | 2019-522934 A | 8/2019 |

OTHER PUBLICATIONS

English Translation of International Search Report issued in International Patent Application No. PCT/JP2020/018304, dated Jul. 7, 2020.

\* cited by examiner

| VDD | PAD[V] | NODE d |
|---|---|---|
| ON | 0 | VDD |
| | 3.3 | VDD |
| OFF | 0 | 0 |
| | 3.3 | PAD/2 |

INPUT CIRCUIT

CROSS-REFERENCE TO RELATED APPLICATION

This application claims priority to International Application No. PCT/JP2020/018304 filed on Apr. 30, 2020, the entire disclosure of which is incorporated by reference herein.

BACKGROUND

The present disclosure relates to an input circuit used for a semiconductor integrated circuit device.

When a semiconductor integrated circuit device is coupled to another electronic device, a signal having a higher voltage than a power supply voltage of the semiconductor integrated circuit device is input therein in some cases. In such a case, in order to protect an internal circuit, a circuit that steps down a voltage of an input signal is provided in an input circuit of the semiconductor integrated circuit device. For example, in an input circuit generally used, a step-down N-type transistor is provided in a preceding stage of an input buffer circuit and a gate of the N-type transistor is coupled to a power supply. Thus, the voltage of the input signal is stepped down to a voltage corresponding to a difference between the power supply voltage and a threshold voltage of the N-type transistor. Accordingly, the internal circuit of the semiconductor integrated circuit device can be protected.

Japanese Patent No. 3092636 discloses a configuration of an input circuit, the configuration including an inverter as an input buffer circuit, a step-down N-type transistor provided in a preceding stage of the inverter, and a P-type transistor coupled between an input node of the inverter and a power supply. The p-type transistor is configured such that a gate thereof is coupled to an output node of the inverter. At a rise of an input signal, when inversion of an output signal of the inverter from high to low starts, the P-type transistor is turned on and a voltage of the input node of the inverter is stepped up to the power supply voltage. Thus, inversion of the output signal is quickly performed, and therefore, a delay time of the inverter can be suppressed to a short time.

SUMMARY

However, in the input circuit disclosed in Japanese Patent No. 3092636, the following problem arises. That is, when the input signal starts falling, the P-type transistor is in an on state. Therefore, the power supply and a low-side drive element of an output circuit at a transmission side are short-circuited therebetween until the output signal of the inverter is inverted to high and the P-type transistor is turned off. In this state, transition of the input signal from high to low is slowed down and inversion of the output signal of the inverter is largely delayed. Therefore, the delay time of the inverter is increased. As a result, a large difference in the delay time of the inverter between rise and fall of the input signal is caused, thus resulting in the occurrence of an error in the pulse width of the output signal of the input circuit.

It is therefore an object of the present disclosure to, in an input circuit, reduce a delay time in an input buffer circuit and suppress an error in a pulse width of an output signal.

According to a first aspect of the present disclosure, an input circuit that receives an input signal at an input terminal includes an input buffer circuit using a first node as an input and a second node as an output, an N-type transistor having a source coupled to the input terminal, a drain coupled to the first node, and a gate coupled to a power supply, and a pull-up circuit provided between the first node and the power supply, and the pull-up circuit is configured to make the power supply and the first node conducive with each other for a predetermined period when the input signal transitions from low to high and not to make the power supply and the first node conductive with each other when the input signal transitions from high to low.

According to this aspect, the input circuit includes an input buffer circuit using a first node as an input and a second node as an output, an N-type transistor having a source coupled to the input terminal, a drain coupled to the first node, and a gate coupled to a power supply, and a pull-up circuit provided between the first node and the power supply. When the input signal transitions from low to high, the pull-up circuit makes the power supply and the first node conducive with each other for a predetermined period. Therefore, the voltage of the first node is increased, inversion of the signal of the second node is quickly performed, and therefore, a delay time in the input buffer circuit is reduced. On the other hand, when the input signal transitions from high to low, the pull-up circuit does not make the power supply and the first node conductive with each other. Thus, the power supply and the low-side drive element of the output circuit at the transmission side are not short-circuited therebetween, the input signal quickly transitions from high to low, and therefore, inversion of the signal of the second node is not delayed. Accordingly, a difference in delay time in the input buffer circuit between rise and fall of the input signal can be reduced, and therefore, an error that occurs in a pulse width of an output signal can be suppressed.

According to a second aspect of the present disclosure, an input circuit that receives an input signal at an input terminal includes an input buffer circuit using a first node as an input and a second node as an output, an N-type transistor having a source coupled to the input terminal, a drain coupled to the first node, and a gate coupled to a power supply, and a pull-up circuit provided between the first node and the power supply, and the pull-up circuit includes first and second P-type transistors coupled in series between the power supply and the first node, the first P-type transistor receives an inversion signal of a signal of the first node at a gate thereof, and the second P-type transistor receives a signal of the second node at a gate thereof when the input buffer circuit is a buffer that does not invert a logic of a signal and receives an inversion signal of the signal of the second node at the gate when the input buffer circuit is an inverter.

According to this aspect, the input circuit includes an input buffer circuit configured to use a first node as an input and a second node as an output, an N-type transistor having a source coupled to the input terminal, a drain coupled to the first node, and a gate coupled to a power supply, and a pull-up circuit provided between the first node and the power supply. The pull-up circuit includes first and second P-type transistors coupled in series between the power supply and the first node. The first P-type transistor receives an inversion signal of a signal of the first node at a gate thereof. The second P-type transistor receives a signal of the second node at a gate thereof when the input buffer circuit is a buffer that does not invert a logic of a signal and receives an inversion signal of the signal of the second node at the gate when the input buffer circuit is an inverter. When the input signal is low, the second P-type transistor receives the low signal at the gate, and therefore, is in an on state. While the input signal transitions from low to high, the first P-type transistor is turned on when the inversion signal of the signal of the first node goes below than a threshold. Therefore, the voltage of the first node is increased, inversion of the signal of the second node is quickly performed, and therefore, a delay time in the input buffer circuit is reduced. On the other hand, when the input signal is high, the second P-type transistor receives the high signal at the gate and accordingly is in an off state. Thus, when the input signal transitions from high to low, the power supply and the low-side drive element of the output circuit at the transmission side are not short-circuited therebetween, the input signal quickly transitions from high to low, and therefore, inversion of the signal of the second node is not delayed. Accordingly, a difference in delay time in the input buffer circuit between rise and fall of the input signal can be reduced, and therefore, an error that occurs in a pulse width of an output signal can be suppressed.

According to the present disclosure, in an input circuit, a delay time in an input buffer circuit can be reduced and an error that occurs in a pulse width of an output signal can be suppressed.

DETAILED DESCRIPTION

Embodiments will be described below with reference to the accompanying drawings. Note that circuit configuration diagrams described below illustrate mainly components related to the present disclosure in a simplified manner. Therefore, for example, components illustrated as being directly coupled to each other are coupled to each other with some other component interposed therebetween and are indirectly coupled to each other in an actual circuit configuration in some cases.

In the following description, "VDD" is used as a reference sign representing both a power supply itself and a power supply voltage thereof. For signals, expressions "high" and "low" represent logical levels of a signal at a high potential side and a low potential side. For transistors, expressions "on" and "off" represent a conductive state and a non-conductive state of a transistor.

In each of the following embodiments, a power supply voltage VDD is 1.8 V and a voltage of an input signal is 3.3 V or 1.8 V. A circuit operation in a case where the voltage of the input signal is 3.3 V will be described.

First Embodiment

Figure 1:
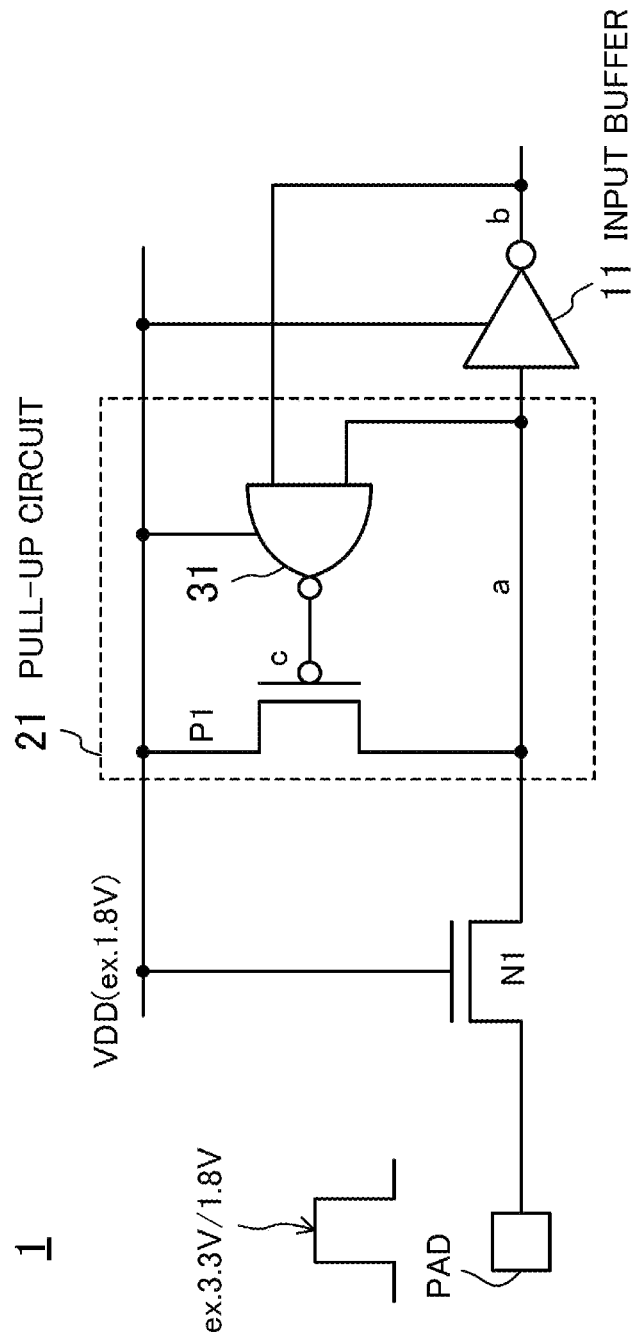
FIG. 1 is a diagram illustrating a circuit configuration example of an input circuit according to a first embodiment.

FIG. 1 illustrates a circuit configuration of an input circuit according to a first embodiment. An input circuit 1 illustrated in FIG. 1 is provided in a semiconductor integrated circuit and receives an input signal sent to the semiconductor integrated circuit from another electronic device at an input terminal PAD. In a case where a voltage of the input signal is higher than the power supply voltage VDD, the input circuit 1 steps down the voltage of the input signal in order to protect an internal circuit of the semiconductor integrated circuit.

The input circuit 1 includes an inverter 11 as an example of an input buffer circuit, a step-down N-type transistor N1 provided between the input terminal PAD and the inverter 11, and a pull-up circuit 21. The inverter 11 uses a node a as an input and a node b as an output, inverts a signal of the node a, and outputs the inverted signal to the node b. The N-type transistor N1 has a source coupled to the input terminal PAD, a drain coupled to the node a, and a gate coupled to the power supply VDD.

The pull-up circuit 21 includes a P-type transistor P1 and a 2-input NAND circuit 31. The P-type transistor P1 has a source coupled to the power supply VDD and a drain coupled to the node a. The 2-input NAND circuit 31 receives a signal of the node a and a signal of the node b as inputs and is configured such that a node c acting as an output node thereof is coupled to a gate of the P-type transistor P1. That is, when the signals of the nodes a and b are both high and a signal of the node c is low, the P-type transistor P1 is turned on. The P-type transistor P1 is off at any other time.

Figure 2:
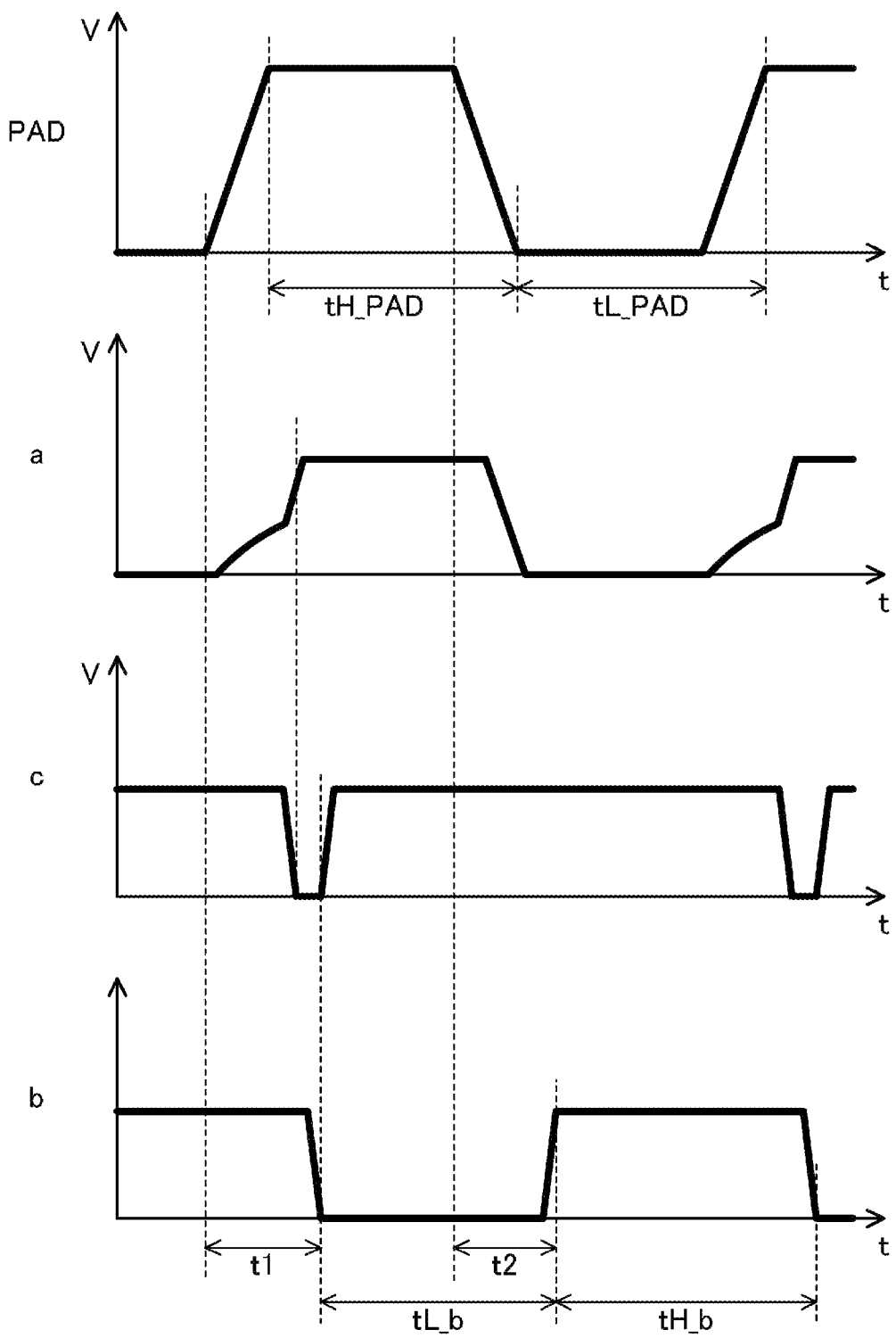
FIG. 2 is a set of waveform diagrams illustrating an operation of the input circuit of FIG. 1.

An operation of the input circuit 1 of FIG. 1 will be described with reference to signal waveforms illustrated in FIG. 2.

(1) When a Rise Signal is Input (an Input Signal Transitions from Low to High)

When an input signal given to the input terminal PAD is low, a signal of the node a is low and a signal of the node b is high. At this time, a signal of the node c is high and the P-type transistor P1 is off.

When the input signal transitions from low to high, a voltage of the node a increases as a voltage of the input signal increases. When the voltage of the node a exceeds a threshold of the NAND circuit 31, the signal of the node c becomes low, and thus, the P-type transistor P1 is turned on. By turning on of the P-type transistor P1, the voltage of the node a is increased and inversion of the signal of the node b is quickly performed. Accordingly, a delay time in the inverter 11 is reduced (t1).

In this case, by designing the input circuit such that a delay time in the NAND circuit 31 is shorter than that in the inverter 11, the P-type transistor P1 can be more quickly turned on than in the example of Japanese Patent No. 3092636.

When the signal of node b transitions from high to low, the signal of the node c becomes high and the P-type transistor P1 is turned off again.

(2) When a Fall Signal is Input (the Input Signal Transitions from High to Low)

When the input signal transitions from high to low, the signal of the node c remains high and the P-type transistor P1 remains off. Therefore, a short circuit does not occur between the power supply VDD and a low-side drive element of an output circuit at a transmission side, the input signal quickly transitions from high to low, and a signal waveform is not blunted. Therefore, inversion of the signal of the node b is not delayed and a delay time in the inverter 11 is not increased (t2).

As a result of the operation described above, for a pulse width of the input signal given to the input terminal PAD, an error does not occur in a pulse width of the signal of the node b (tH_b=tL_PAD, tL_b=tH_PAD).

That is, in this embodiment, the pull-up circuit 21 is configured to make the power supply VDD and the node a conductive with each other for a predetermined period when the input signal transitions from low to high and, on the other hand, not to make the power supply VDD and the node a conductive with each other when the input signal transitions from high to low.

As described above, according to this embodiment, the input circuit 1 includes the inverter 11 using the node a as the input and the node b as the output, the N-type transistor N1 having the source coupled to the input terminal PAD, the drain coupled to the node a, and the gate coupled to the power supply VDD, and the pull-up circuit 21 provided between the node a and the power supply VDD. When the input signal transitions from low to high, in the pull-up circuit 21, the output node c of the NAND circuit 31 is low for a predetermined period and the P-type transistor P1 makes the power supply VDD and the node a conductive with each other. Therefore, the voltage of the node a is increased, inversion of the signal of the node b is quickly performed, and therefore, a delay time in the inverter 11 is reduced. On the other hand, when the input signal transitions from high to low, in the pull-up circuit 21, the output node c of the NAND circuit 31 does not become low and the P-type transistor P1 does not make the power supply VDD and the node a conductive with each other. Thus, the power supply VDD and the low-side drive element of the output circuit at the transmission side are not short-circuited therebetween, the input signal quickly transitions from high to low, and therefore, inversion of the signal of the node b is not delayed. Accordingly, a difference in delay time in the inverter 11 between rise and fall of the input signal can be reduced, and therefore, an error that occurs in a pulse width of an output signal can be suppressed.

Note that, as the input buffer circuit, instead of the inverter 11, a buffer that does not invert a logic of a signal may be used. In this case, for example, an inverter may be provided between the node b and the NAND circuit 31. That is, the signal of the node a may be given as a first input to the NAND circuit 31, and when the input buffer circuit is an inverter, the signal of the node b may be given as a second input to the NAND circuit 31 and, when the input buffer circuit is a buffer that does not invert a logic of a signal, an inversion signal of the signal of the node b is given as the second input to the NAND circuit 31.

Second Embodiment

Figure 3:
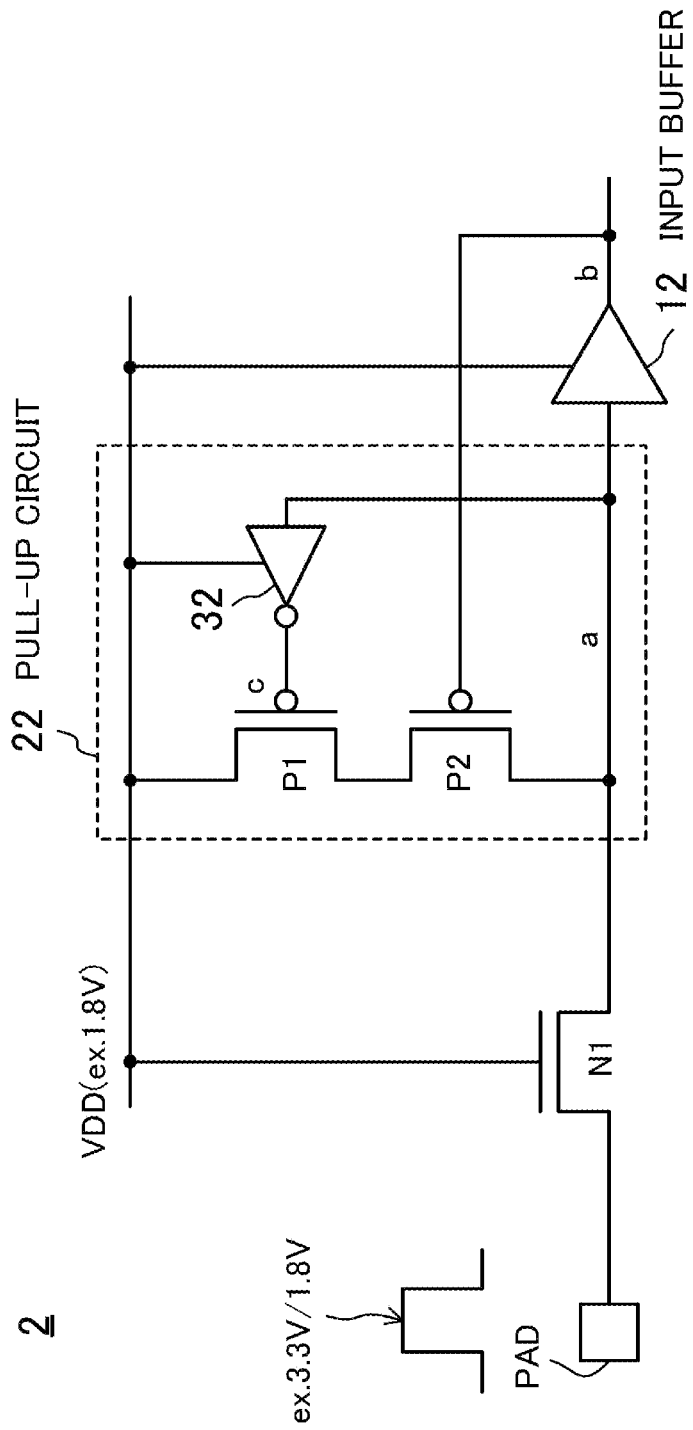
FIG. 3 is a diagram illustrating a circuit configuration example of an input circuit according to a second embodiment.

FIG. 3 illustrates a circuit configuration of an input circuit according to a second embodiment. An input circuit 2 illustrated in FIG. 3 has a basic configuration similar to that of the input circuit 1 illustrated in FIG. 1. The input circuit 2 includes, as an example of the input buffer circuit, a buffer 12 that does not invert a signal and a pull-up circuit 22 having a different configuration from that of the pull-up circuit 21 illustrated in FIG. 1.

The pull-up circuit 22 includes P-type transistors P1 and P2 coupled in series between a power supply VDD and a node a and an inverter 32. The inverter 32 receives a signal of the node a and a node c acting as an output node of the inverter 32 is coupled to a gate of the P-type transistor P1. The P-type transistor P2 receives a signal of a node b that is an output node of the buffer 12 at a gate thereof.

Figure 4:
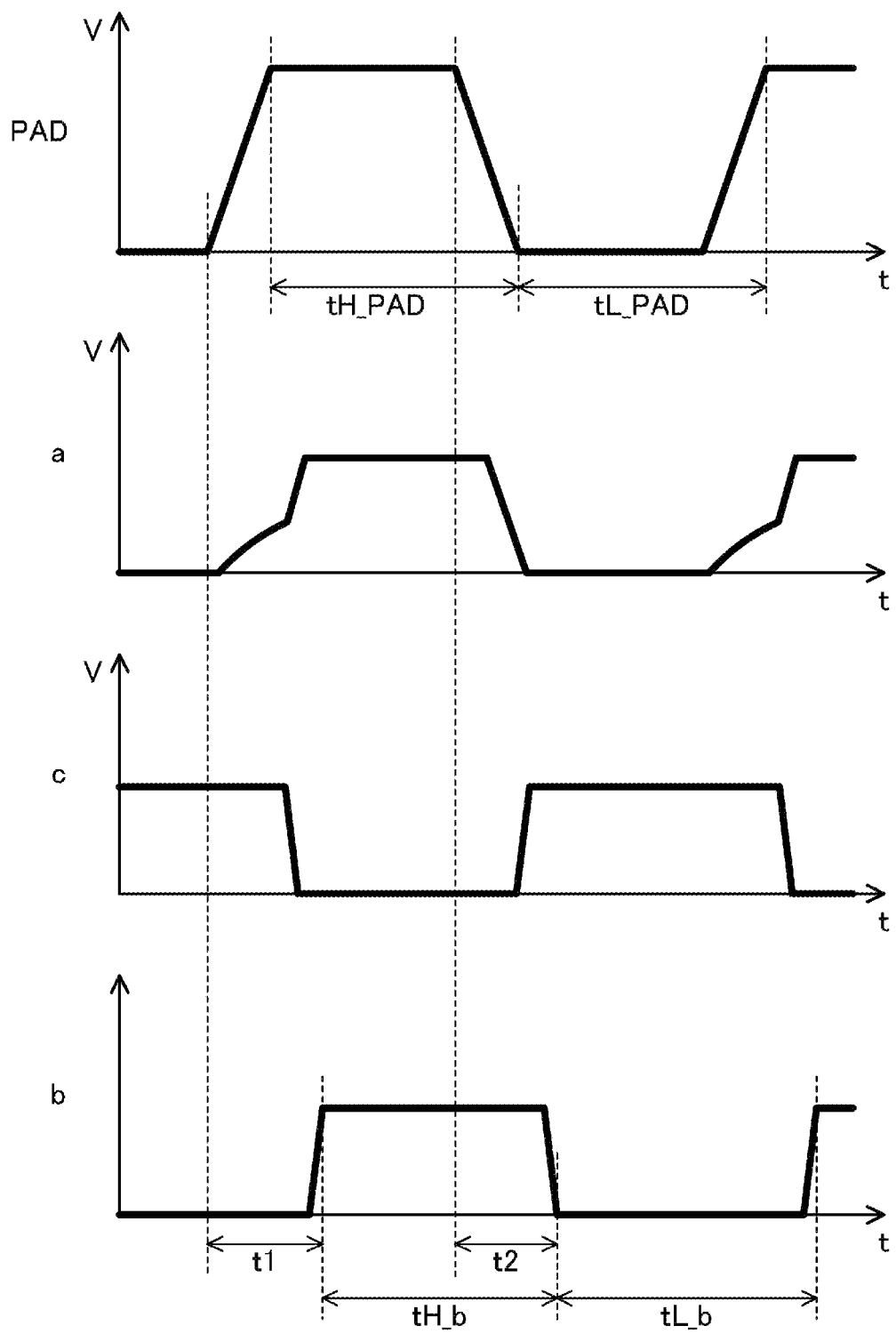
FIG. 4 is a set of waveform diagrams illustrating an operation of the input circuit of FIG. 3.

An operation of the input circuit 2 of FIG. 3 will be described with reference with signal waveforms illustrated in FIG. 4.

(1) When a Rise Signal is Input (an Input Signal Transitions from Low to High)

When an input signal given to an input terminal PAD is low, the signal of the node a is low and the signal of the node b is low. At this time, a signal of the node c is high and the P-type transistor P1 is off. The P-type transistor P2 is on.

When the input signal transitions from low to high, a voltage of the node a increases as a voltage of the input signal increases. When the voltage of the node a exceeds a threshold of the inverter 32, the signal of the node c becomes low, and thus, the P-type transistor P1 is turned on. Since the P-type transistor P2 is on, by turning on the P-type transistor P1, the voltage of the node a is increased, and inversion of the node b is quickly performed. Accordingly, a delay time in the buffer 12 is reduced (t1).

In this case, by designing the input circuit such that a delay time in the inverter 32 is shorter than the delay time in the buffer 12, the P-type transistor P1 can be more quickly turned on than in the example of Japanese Patent No. 3092636.

When the signal of the node b transitions from low to high, the P-type transistor P2 is turned off (2) When a Fall Signal is Input (the Input Signal Transitions from High to Low)

When the input signal transitions from high to low, the signal of the node b remains high and the P-type transistor P2 remains off. Therefore, a short circuit does not occur between the power supply VDD and a low-side drive element of an output circuit at a transmission side, the input signal quickly transitions from high to low, and a signal waveform is not blunted. Therefore, inversion of the signal of the node b is not delayed and a delay time in the buffer 12 is not increased (t2).

Subsequently, when the voltage of the node a drops to go below a threshold of the inverter 32, the signal of the node c becomes high and the P-type transistor P1 is turned off again. Thereafter, a delay time in the buffer 12 lapses and the signal of the node b becomes low, and therefore, the P-type transistor P2 is turned on again. However, the P-type transistor P1 is turned off before the P-type transistor P2 is turned on, and therefore, at inputting a fall signal, the power supply VDD and the node a are not made conductive with each other.

As a result of the operation described above, for a pulse width of the input signal given to the input terminal PAD, an error does not occur in a pulse width of the signal of the node b (tH_b=tH_PAD, tL_b=tL_PAD).

That is, the pull-up circuit 22 is configured to make the power supply VDD and the node a conductive with each other for a predetermined period when the input signal transitions from low to high and, on the other hand, not to make the power supply VDD and the node a conductive with each other when the input signal transitions from high to low.

As described above, according to this embodiment, the input circuit 2 includes the buffer 12 using the node a as the input and the node b as the output, the N-type transistor N1 having the source coupled to the input terminal PAD, the drain coupled to the node a, and the gate coupled to the power supply VDD, and the pull-up circuit 22 provided between the node a and the power supply VDD. The pull-up circuit 22 includes the P-type transistors P1 and P2 coupled in series between the power supply VDD and the node a. The P-type transistor P1 receives an inversion signal of the signal of the node a at a gate thereof, and the P-type transistor P2 receives the signal of the node b at a gate thereof. When the input signal is low, the P-type transistor P1 receives a high signal at the gate, and thus, is in an off state. When the input signal transitions from low to high, the P-type transistor P1 is turned on at a timing at which the inversion signal of the signal of the node a goes below a threshold. Therefore, the voltage of the node a is increased, inversion of the signal of the node b is quickly performed, and therefore, a delay time in the buffer 12 is reduced. On the other hand, when the input signal is high, the P-type transistor P2 receives a high signal at the gate, and thus, is in an off state. Therefore, when the input signal transitions from high to low, the power supply VDD and the low-side drive element of the output circuit at the transmission side are not short circuited therebetween, the input signal quickly transitions from high to low, and therefore, inversion of the signal of the node b is not delayed. Accordingly, a difference in delay time in the buffer 12 between rise and fall of the input signal can be reduced, and therefore, an error that occurs in a pulse width of an output signal can be suppressed.

Figure 5:
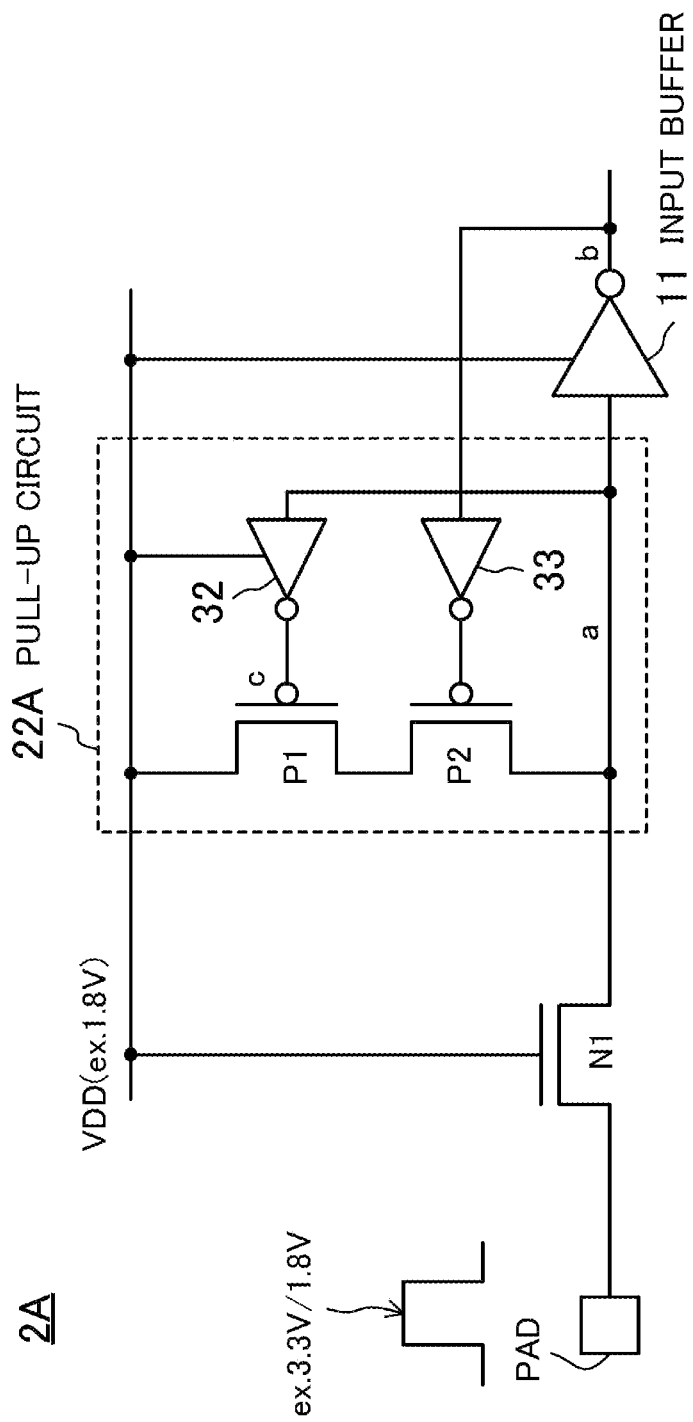
FIG. 5 is a diagram illustrating another circuit configuration example of the input circuit according to the second embodiment.

FIG. 5 illustrates another circuit configuration example of the input circuit according to this embodiment. As in an input circuit 2A illustrated in FIG. 5, as the input buffer circuit, the inverter 11 may be used. In this case, for example, in a pull-up circuit 22A, an inverter 33 may be provided between the node b and a gate of the P-type transistor P2 such that an inversion signal of the signal of the node b is given to the gate of the P-type transistor P2.

Third Embodiment

Figure 6:
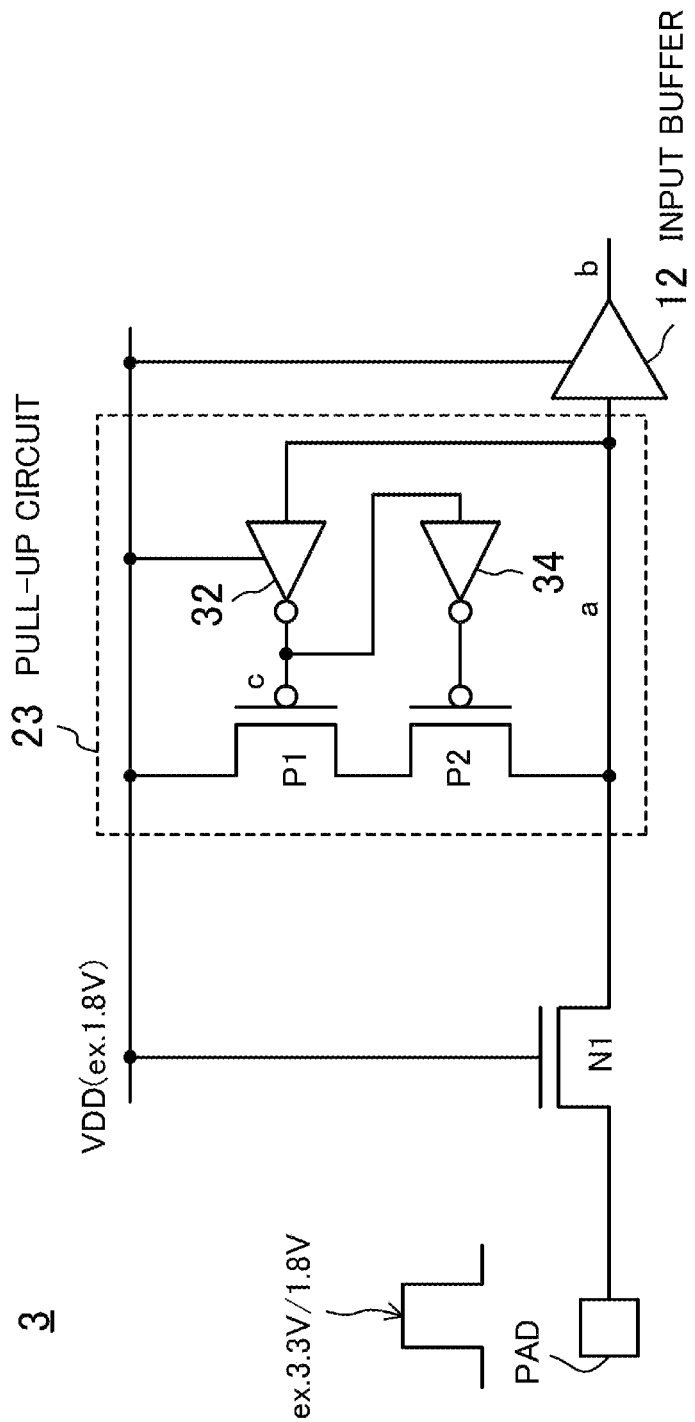
FIG. 6 is a diagram illustrating a circuit configuration example of an input circuit according to a third embodiment.

FIG. 6 illustrates a circuit configuration of an input circuit according to a third embodiment. An input circuit 3 illustrated in FIG. 6 has a basic configuration similar to that of the input circuit 2 illustrated in FIG. 3. The input circuit 3 includes a pull-up circuit 23 having a different configuration from that of the pull-up circuit 22 illustrated in FIG. 3.

The pull-up circuit 23 includes P-type transistors P1 and P2 coupled in series between a power supply VDD and a node a and inverters 32 and 34. The inverter 32 receives a signal of the node a and a node c acting as an output node of the inverter 32 is coupled to a gate of the P-type transistor P1. The inverter 34 receives a signal of the node c and an output node thereof is coupled to a gate of the P-type transistor P2.

That is, in the input circuit 2 illustrated in FIG. 3, the signal of the node b is given to the gate of the P-type transistor P2, and on the other hand, in the input circuit 3 illustrated in FIG. 6, a signal obtained by delaying the signal of the node a by the inverters 32 and 34 is given to the gate of the P-type transistor P2.

An operation of the input circuit 3 of FIG. 6 is similar to that of the input circuit 2 of FIG. 3. That is, the pull-up circuit 23 is configured to make the power supply VDD and the node a conductive with each other for a predetermined period when an input signal transitions from low to high, and on the other hand, not to make the power supply VDD and the node a conductive with each other when the input signal transitions from high to low. In addition, in the input circuit 3 of FIG. 6, control of the P-type transistor P2 is performed without depending on characteristics of a buffer 12 that is an example of the input buffer circuit and without influencing the characteristics of the buffer 12.

Therefore, according to this embodiment, similar to the second embodiment, a difference in delay time in the buffer 12 between rise and fall of the input signal can be reduced, and therefore, an error that occurs in a pulse width of an output signal can be suppressed.

Fourth Embodiment

Figure 7:
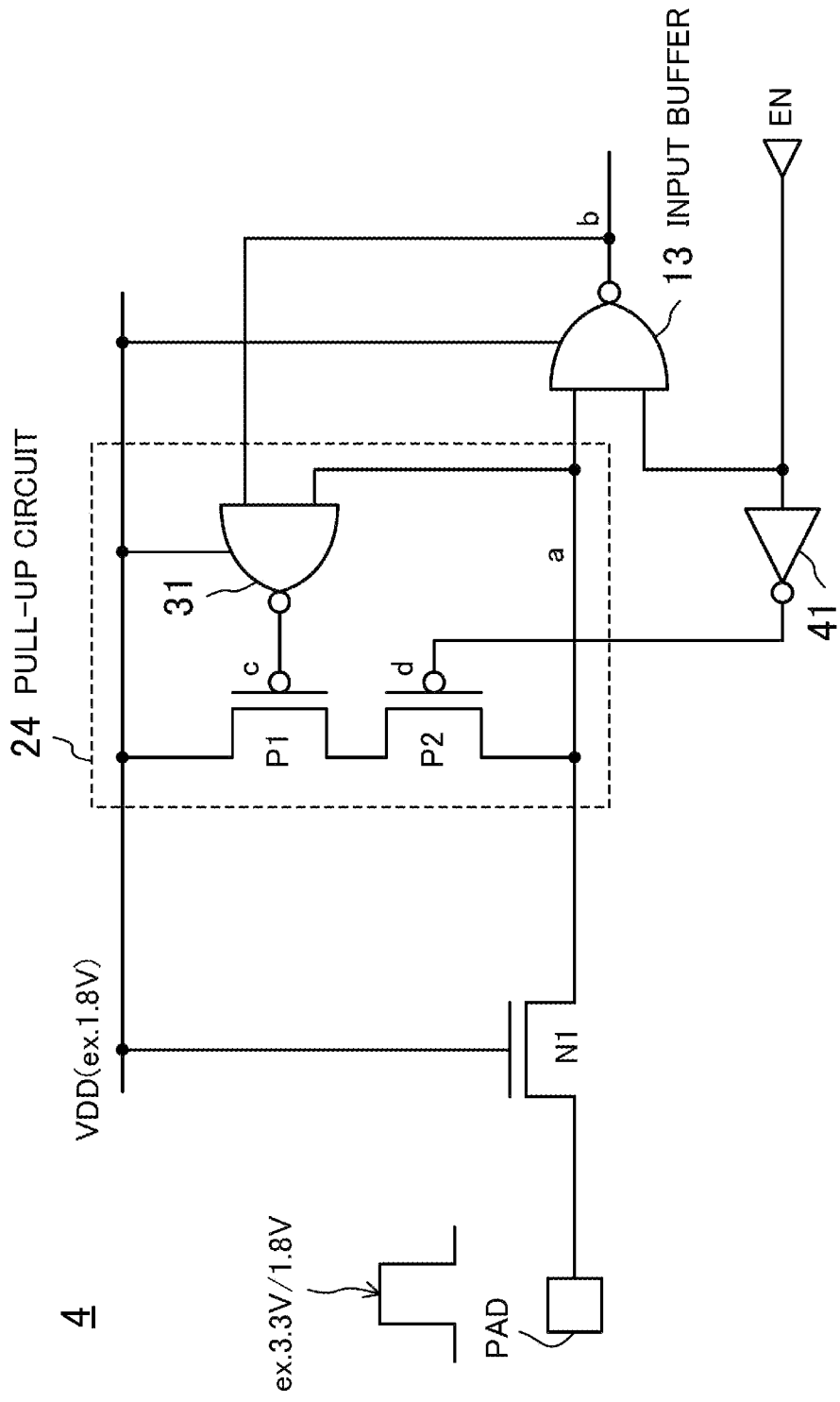
FIG. 7 is a diagram illustrating a circuit configuration example of an input circuit according to a fourth embodiment.

FIG. 7 illustrates a circuit configuration of an input circuit according to a fourth embodiment. An input circuit 4 illustrated in FIG. 7 is configured to receive an enable signal EN and control passing/non-passing of an input signal in accordance with the enable signal EN. In this case, the input circuit 4 is configured to cause the input signal to pass (enable) when the enable signal EN is "1" (high) and not to pass (disable) when the enable signal EN is "0" (low).

The input circuit 4 includes a 2-input NAND circuit 13 as the input buffer circuit. The 2-input NAND circuit 13 receives a signal of a node a and the enable signal EN as inputs and uses a node b as an output. When the enable signal EN is "1," an inversion signal of the signal of the node a is output to the node b and, when the enable signal EN is "0," the node b is fixed to be high. That is, the 2-input NAND circuit 13 functions as an inverter that causes a signal to pass when the enable signal EN is "1" and not to pass when the enable signal EN is "0."

A pull-up circuit 24 includes P-type transistors P1 and P2 coupled in series between a power supply VDD and the node a and a NAND circuit 31. The NAND circuit 31 receives a signal of the node a and a signal of the node b as inputs and is configured such that a node c acting as an output node thereof is coupled to a gate of the P-type transistor P1. The P-type transistor P2 has a gate coupled to a node d that is an output node of an inverter 41 that receives the enable signal EN as an input. The pull-up circuit 24 has a configuration obtained by adding the P-type transistor P2 to the pull-up circuit 21 of FIG. 1.

In the input circuit 4 of FIG. 7, when the enable signal EN is "1," the 2-input NAND circuit 13 functions as an inverter and the P-type transistor P2 is turned on, and therefore, the input circuit 4 operates similarly to the input circuit 1 of FIG. 1 according to the first embodiment.

Figure 8:
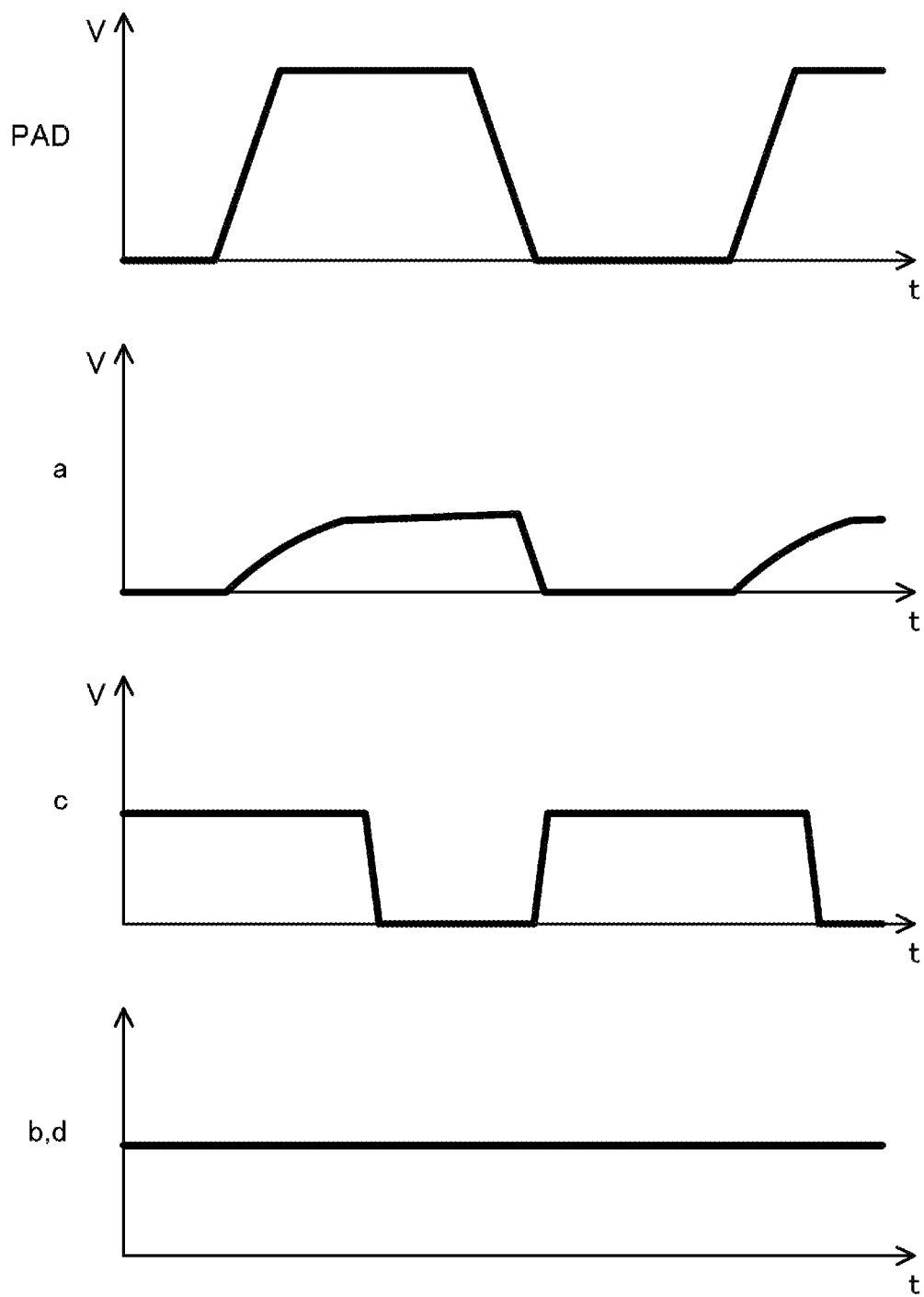
FIG. 8 is a set of waveform diagrams illustrating an operation of the input circuit of FIG. 7.

FIG. 8 is a set of signal waveforms diagrams illustrating an operation when the enable signal EN is "0." As illustrated in FIG. 8, when the enable signal EN is "0," the node b is fixed to be high. Therefore, a signal of the node c given to the gate of the P-type transistor P1 varies in accordance with transition of the input signal. However, a signal of the node d given to a gate of the P-type transistor P2 is fixed to be high, and therefore, the P-type transistor P2 is off. Therefore, a short circuit does not occur between the power supply VDD and a low-side drive element of an output circuit at a transmission side and a waveform of the input signal is not blunted.

Suppose that the pull-up circuit 24 has the same configuration as that of the pull-up circuit 21 of FIG. 1 without adding the P-type transistor P2. In this case, when the signal of the node c becomes low, a short circuit occurs between the power supply VDD and the low-side drive element of the output circuit at the transmission side and the waveform of the input signal is blunted. In this embodiment, this problem is solved. That is, according to this embodiment, passing/non-passing of the input signal can be controlled by the enable signal EN and blunting of the waveform of the input signal can be avoided when the enable signal EN is "0."

Figure 9:
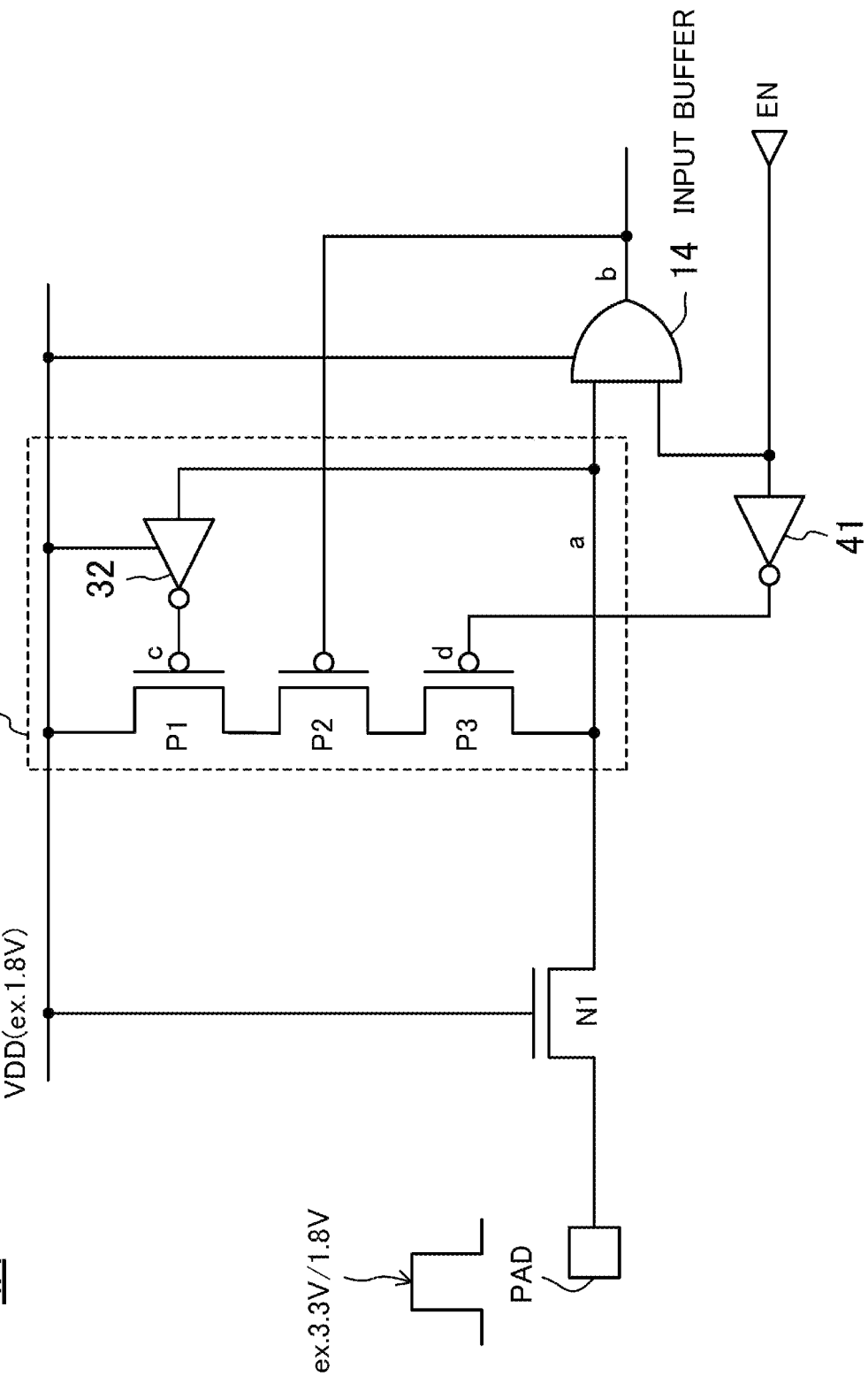
FIG. 9 is a diagram illustrating another circuit configuration example of the input circuit according to the fourth embodiment.

FIG. 9 illustrates another circuit configuration example of the input circuit according to this embodiment. An input circuit 4A illustrated in FIG. 9 includes a 2-input AND circuit 14 as the input buffer circuit. The 2-input AND circuit 14 receives a signal of the node a and an enable signal EN as inputs and uses the node b as an output. When the enable signal EN is "1," the signal of the node a is output to the node b and, when the enable signal EN is "0," the node b is fixed to be low. That is, the 2-input AND circuit 14 functions as a buffer that causes a signal to pass when the enable signal EN is "1" and not to pass when the enable signal EN is "0."

A pull-up circuit 24A includes P-type transistors P1, P2, and P3 coupled in series between a power supply VDD and a node a and an inverter 32. The inverter 32 receives a signal of the node a and a node c acting as an output node thereof is coupled to a gate of the P-type transistor P1. The P-type transistor P2 receives a signal of a node b that is an output node of the 2-input AND circuit 14 at a gate thereof. The P-type transistor P3 has a gate coupled to a node d that is an output node of an inverter 41 that receives the enable signal EN as an input. The pull-up circuit 24A has a configuration obtained by adding the P-type transistor P3 to the pull-up circuit 22 of FIG. 3.

In the input circuit 4A of FIG. 9, when the enable signal EN is "1," the 2-input AND circuit 14 functions as a buffer and the P-type transistor P3 is turned on, and therefore, the input circuit 4A operates similarly to the input circuit 2 of FIG. 3 according to the second embodiment. On the other hand, when the enable signal EN is "0," the node b is fixed to be low and the P-type transistor P2 is on. However, a signal of the node d given to the gate of the P-type transistor P3 is fixed to be high, and therefore, the P-type transistor P3 is off. Therefore, a short circuit does not occur between the power supply VDD and a low-side drive element of an output circuit at a transmission side and a waveform of the input signal is not blunted. Accordingly, similar advantageous effects to those of the input circuit 4 of FIG. 7 can be achieved.

Figure 10:
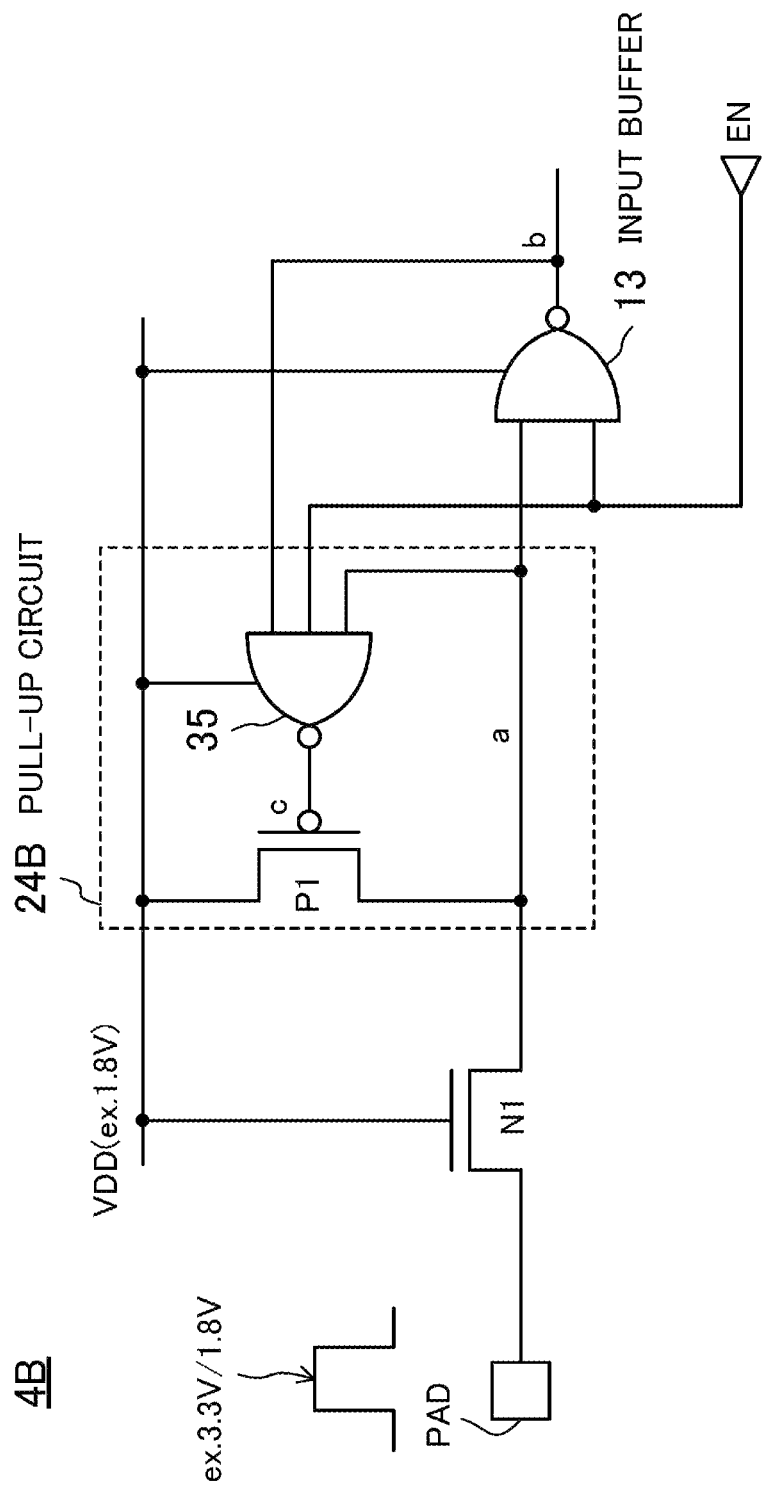
FIG. 10 is a diagram illustrating still another circuit configuration example of the input circuit according to the fourth embodiment.

FIG. 10 illustrates still another circuit configuration example of the input circuit according to this embodiment. An input circuit 4B illustrated in FIG. 10 includes a 2-input NAND circuit 13 as the input buffer circuit. Similar to the input circuit 4 illustrated in FIG. 7, the 2-input NAND circuit 13 receives a signal of a node a and an enable signal EN as inputs and uses a node b as an output.

A pull-up circuit 24B includes a P-type transistor P1 and a 3-input NAND circuit 35. The P-type transistor P1 has a source coupled to the power supply VDD and a drain coupled to the node a. The 3-input NAND circuit 35 receives the signal of the node a, a signal of the node b, and the enable signal EN as inputs and is configured such that a node c acting as an output node thereof is coupled to a gate of the P-type transistor P1.

In the input circuit 4B of FIG. 10, when the enable signal EN is "1," the 2-input NAND circuit 13 functions as an inverter and the 3-input NAND circuit 35 functions as a 2-input NAND circuit, and therefore, the input circuit 4B operates similarly to the input circuit 1 of FIG. 1 according to the first embodiment. On the other hand, when the enable signal EN is "0," the node b is fixed to be high, but the 3-input NAND circuit 35 has the enable signal EN as an input and the node c is fixed to be high. Therefore, the P-type transistor P1 is off. Thus, a short circuit does not occur between the power supply VDD and a low-side drive element of an output circuit at a transmission side and a waveform of the input signal is not blunted. Accordingly, similar advantageous effects to those of the input circuit 4 of FIG. 7 can be achieved.

In the configuration of FIG. 10, only one stage of a P-type transistor is arranged between the power supply VDD and the node a. From a viewpoint of area efficiency, this configuration is effective in a case where it is desired to avoid a multi-stage configuration of transistors.

Note that, even in a case where a logic reverse to the above-described logic of the enable signal EN is applied, that is, in a case where, when the enable signal EN is "0," an input signal is caused to pass (enable) and, when the enable signal EN is "1," the input signal is caused not to pass (disable), this embodiment is applicable. In this case, for example, in the configuration of FIG. 7, the enable signal EN may be given to the gate of the P-type transistor P2 and an inversion signal of the enable signal EN may be given to the 2-input NAND circuit 13.

Fifth Embodiment

Figure 11:
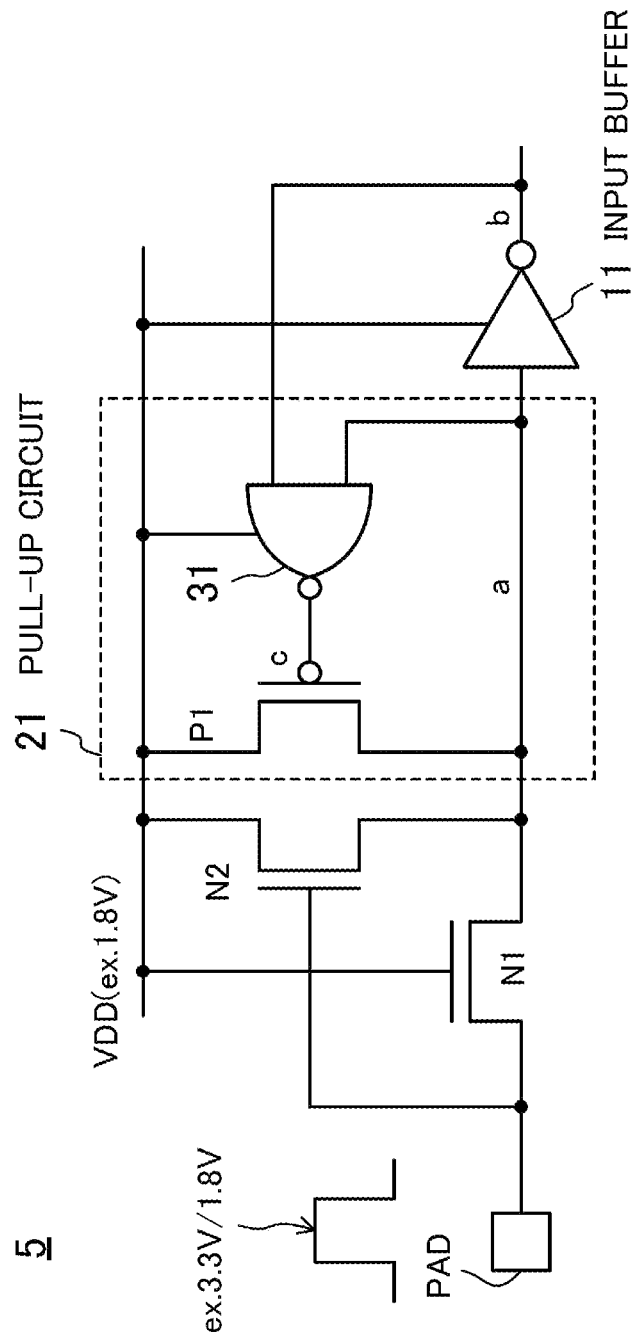
FIG. 11 is a diagram illustrating a circuit configuration example of an input circuit according to a fifth embodiment.

FIG. 11 illustrates a circuit configuration of an input circuit according to a fifth embodiment. An input circuit 5 illustrated in FIG. 11 includes, in addition to the components of the input circuit 1 illustrated in FIG. 1 according to the first embodiment, an N-type transistor N2 provided between a power supply VDD and a node a. That is, the N-type transistor N2 is provided in parallel to the P-type transistor P1 of the pull-up circuit 21. The N-type transistor N2 has a drain coupled to the power supply VDD, a source coupled to the node a, and a gate coupled to the input terminal PAD.

An operation of the input circuit 5 of FIG. 11 is similar to that of the input circuit 1 of FIG. 1. However, when a rise signal having a higher voltage than the power supply voltage VDD is input to the input terminal PAD (when an input signal transitions from low to high), the N-type transistor N2 is turned on. Thus, step up of a voltage of the node a is assisted.

Figure 12:
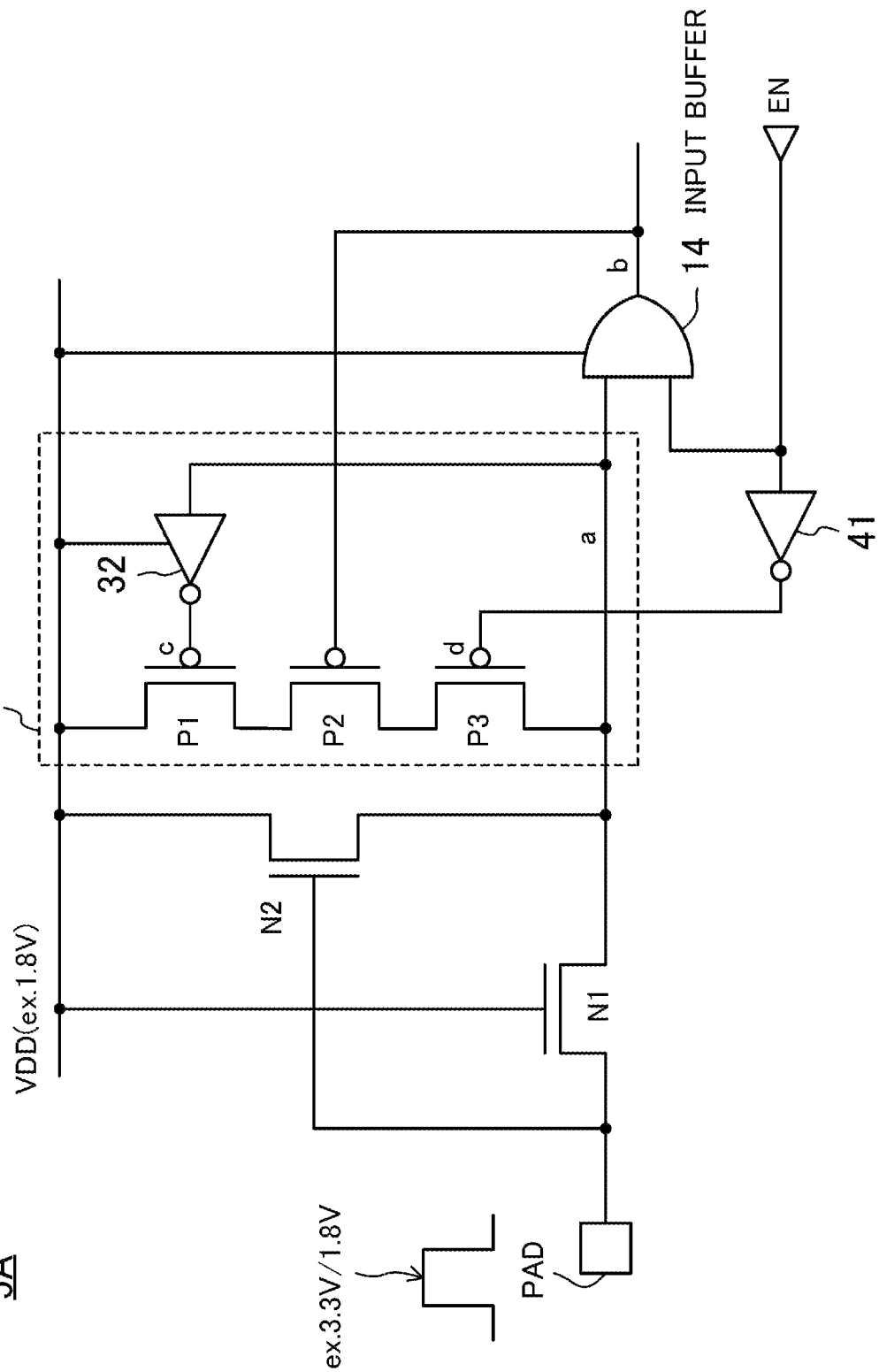
FIG. 12 is a diagram illustrating another circuit configuration example of the input circuit according to the fifth embodiment.

FIG. 12 illustrates another circuit configuration example of the input circuit according to the fifth embodiment. An input circuit 5A illustrated in FIG. 12 includes, in addition to the components of the input circuit 4A illustrated in FIG. 9 according to the fourth embodiment, an N-type transistor N2 provided between a power supply VDD and a node a. That is, the N-type transistor N2 is provided in parallel to the P-type transistors P1, P2, and P3 of the pull-up circuit 24A. The N-type transistor N2 has a drain coupled to the power supply VDD, a source coupled to the node a, and a gate coupled to the input terminal PAD.

An operation of the input circuit 5A of FIG. 12 is similar to that of the input circuit 4A of FIG. 9. However, when a rise signal having a higher voltage than the power supply voltage VDD is input to the input terminal PAD (when an input signal transitions from low to high), the N-type transistor N2 is turned on. Thus, step up of a voltage of the node a is assisted.

Note that, similar to the configurations of FIG. 11 and FIG. 12, in the other configurations of the input circuits of the first to fourth embodiments described above, an N-type transistor N2 may be added.

Sixth Embodiment

In accordance with recent needs of power saving, systems that turn on/off a power supply of a semiconductor integrated circuit have been generally used. However, in the input circuit 1 illustrated in FIG. 1, when the power supply is off, that is, when VDD is 0 V, reception of a high-voltage signal at an input terminal PAD is not allowed. That is, assuming that a breakdown voltage between a drain and a gate of an N-type transistor N1 is 1.8 V, while VDD is 0V, when the input terminal PAD receives an input signal of 3.3 V, a voltage between the drain and the gate of the N-type transistor N1 is 3.3 V and exceeds the breakdown voltage.

Therefore, this embodiment provides an input circuit in which a power supply can be turned off, that is, VDD can be caused to be 0 V, without depending on a signal received by an input terminal PAD.

Figure 13:
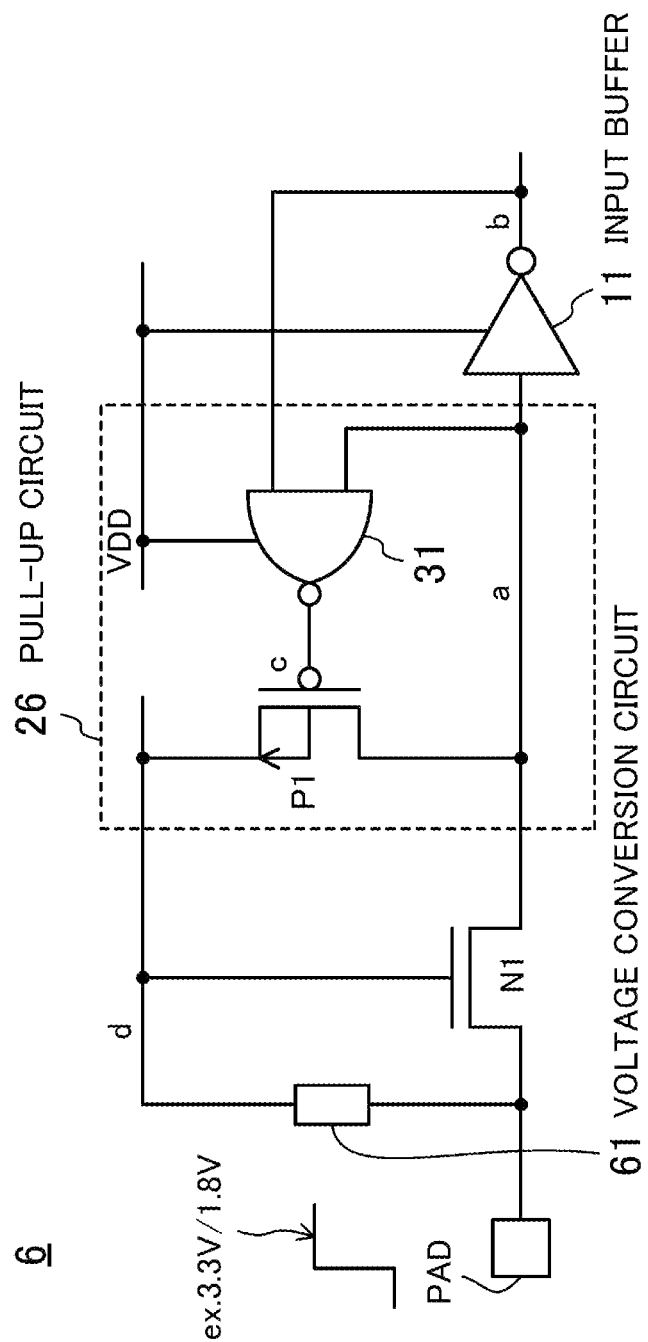
FIG. 13 is a diagram illustrating a circuit configuration example of an input circuit according to a sixth embodiment.

FIG. 13 illustrates a circuit configuration of an input circuit according to a sixth embodiment. An input circuit 6 illustrated in FIG. 13 has a basic configuration similar to that of the input circuit 1 illustrated in FIG. 1. However, a gate of an N-type transistor N1 and a drain of a P-type transistor P1 in a pull-up circuit 26 are coupled to a node d, not a power supply VDD. The node d is coupled to an input terminal PAD via a voltage conversion circuit 61. The voltage conversion circuit 61 outputs the power supply voltage VDD to the node d when the power supply VDD is on, and divides a voltage of the input terminal PAD and outputs the divided voltage to the node d when the power supply VDD is off.

Figures 14A, 14B:
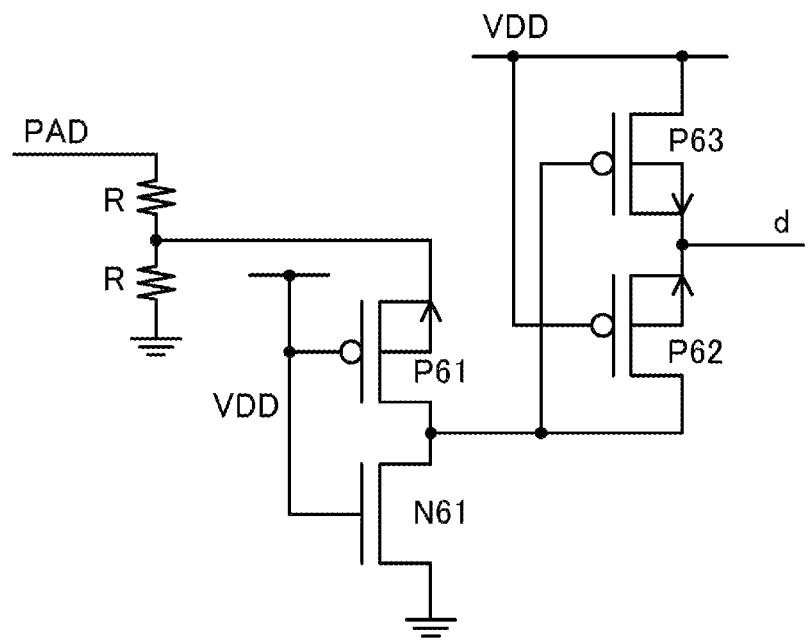
FIG. 14A is a diagram illustrating a circuit configuration example of a voltage conversion circuit in FIG. 13
FIG. 14B is a table illustrating an example of an input/output voltage of the circuit of FIG. 14A.

FIG. 14A illustrates a circuit configuration example of the voltage conversion circuit 61 and FIG. 14B illustrates a relationship between input/output voltages of the voltage conversion circuit 61. In the voltage conversion circuit 61, when the power supply is on (VDD=1.8 V), an N-type transistor N61 is turned on, and thus, a gate voltage of a P-type transistor P63 becomes 0 V. Accordingly, the P-type transistor P63 is turned on. As a result, the voltage VDD is output to the node d regardless of the signal received by the input terminal PAD. On the other hand, assume that, when the power supply is off (VDD=0V), a high signal (3.3 V) is given to the input terminal PAD. P-type transistors P61 and P62 are both turned on because the gate voltage is 0 V. Therefore, a voltage divided by resistances R coupled in series, that is, 3.3/2 V, is output to the node d via the transistors P61 and P62. Note that the configuration of the voltage conversion circuit 61 illustrated in FIG. 14A is merely an example, and the configuration of the voltage conversion circuit 61 is not limited thereto.

The input circuit 6 of FIG. 13 operates in the following manner. When the power supply is on (VDD=1.8 V), the power supply voltage VDD is output to the node d by an operation of the voltage conversion circuit 61. Therefore, the input circuit 6 of FIG. 13 performs the same operation as that of the input circuit 1 of FIG. 1.

On the other hand, while the power supply is off (VDD=0 V), when a high signal (3.3 V) is given to the input terminal PAD, the voltage of the node d is caused to be 3.3/2 V by the operation of the voltage conversion circuit 61. At this time, the N-type transistor N1 is turned on. The voltage of the node a is stepped down from the voltage of 3.3 V of the input terminal PAD due to a pinch-off characteristic of the N-type transistor N1 and does not exceed the voltage of the node d. The voltage of the node c is approximately 0 V because of VDD=0 V, the P-type transistor P1 is turned on and the node a and the node d are made conductive with each other. As a result, the voltage of the node a becomes 3.3/2 V.

As described above, the gate of the N-type transistor N1 is coupled to the node d, not the power supply VDD, and therefore, while the power supply is off, even when a high signal is given to the input terminal PAD, the voltage between the drain and the gate of the N-type transistor N1 does not exceed the breakdown voltage thereof.

Moreover, the drain of the P-type transistor P1 is coupled to the node d, not the VDD, and therefore, while the power supply is off, even when a high signal is given to the input terminal PAD, an unnecessary inflow current from the input terminal PAD is not generated. That is, with the drain of the P-type transistor P1 coupled to the power supply VDD, while the power supply is off, when a high signal is given to the input terminal PAD, a current flows in from the input terminal PAD via a route of the N-type transistor N1, the node a, the P-type transistor P1, and VDD. This problem is avoided in this embodiment.

Furthermore, a stepped down voltage is given to the node a, and therefore, the voltage does not exceed a breakdown voltage of a transistor provided in a following stage.

Therefore, according to this embodiment, in the input circuit 6, the power supply can be turned off without causing deterioration and breakdown of the transistors and without causing the generation of an unnecessary inflow current.

Note that this embodiment has been described herein using as an example a case where this embodiment is applied to the first embodiment. However, this embodiment can be applied to the other embodiments described above. That is, the gate of the N-type transistor N1 and the drain of the P-type transistor P1 in the pull-up circuit 22 or the like may be coupled to the node d coupled to the input terminal PAD via the voltage conversion circuit 61. Furthermore, in the input circuit 5 illustrated in FIG. 11 and the input circuit 5A illustrated in FIG. 12, the drain of the N-type transistor N2 may be coupled to the node d as well.

Seventh Embodiment

Figure 15:
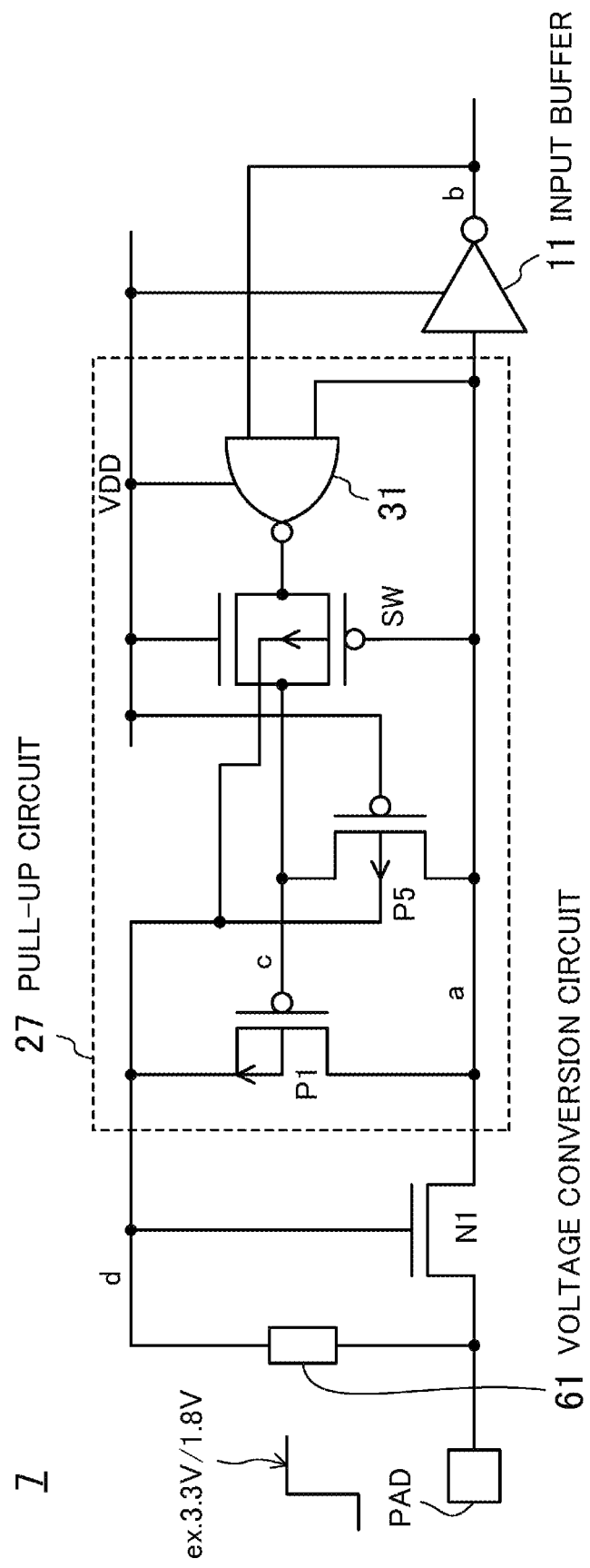
FIG. 15 is a diagram illustrating a circuit configuration example of an input circuit according to a seventh embodiment.

FIG. 15 illustrates a circuit configuration of an input circuit according to a seventh embodiment. An input circuit 7 illustrated in FIG. 15 has a basic configuration similar to that of the input circuit 6 of FIG. 13. However, in a pull-up circuit 27, a P-type transistor P5 and a transfer gate switch SW including a P-type transistor and an N-type transistor coupled in parallel are added.

The P-type transistor P5 is coupled between a node c acting as a gate of a P-type transistor P1 and a node a acting as a source thereof. A gate of the P-type transistor P5 is coupled to a power supply VDD. The transfer gate switch SW is coupled between the node c and an output node of the NAND circuit 31. A gate of the N-type transistor forming the transfer gate switch SW is coupled to the power supply VDD and a gate of the P-type transistor forming the transfer gate switch SW is coupled to the node a.

The input circuit 7 illustrated in FIG. 15 operates in the following manner. When the power supply is on (VDD=1.8 V), the P-type transistor P5 is turned off, and the transfer gate switch SW is turned on because the N-type transistor thereof is turned on. Therefore, the input circuit 7 of FIG. 15 performs the same operation as that of the input circuit 6 of FIG. 13.

On the other hand, while the power supply is off (VDD=0 V), when a high signal (3.3 V) is given to the input terminal PAD, the P-type transistor P5 is turned on, and thus, the node a and the node c are made conductive with each other and voltages of the nodes a and c are the same as that of the node d. Therefore, the P-type transistor P1 is turned off. In the transfer gate switch SW, the N-type transistor is turned off because a gate voltage thereof is 0 V, and the P-type transistor is turned off because a voltage of a drain (the node c) thereof is equal to a voltage of a gate (the node a) thereof. Accordingly, the transfer gate switch SW is turned off. As a result, the node c and the output node of the NAND circuit 31 are disconnected from each other, and therefore, the generation of an unnecessary inflow current from the P-type transistor P5 via the NAND circuit 31 can be prevented.

Therefore, according to this embodiment, in the input circuit 7, the power supply can be turned off without causing deterioration and breakdown of the transistors and without causing the generation of an unnecessary inflow current.

Note that this embodiment has been described herein using as an example a case where this embodiment is applied to the circuit configuration of the first embodiment. However, this embodiment can be applied to the circuit configurations of the other embodiments described above. That is, in each of the pull-up circuits, the P-type transistor P5 may be coupled between any one of the gates of the P-type transistors P1, P2, and P3 and the node a and the transfer gate switch SW may be provided between the gate and a node of a circuit in a preceding stage that transmits a signal to the gate.

For example, in the input circuit 2 of FIG. 3, the P-type transistor P5 may be coupled between the gate of the P-type transistor P1 and the node a and the transfer gate switch SW may be provided between the gate of the P-type transistor P1 and the output node of the inverter 32. As another option, the P-type transistor P5 may be coupled between the gate of the P-type transistor P2 and the node a and the transfer gate switch SW may be provided between the gate of the P-type transistor P2 and the buffer 12.

Note that the present disclosure is not limited to the configurations described in the above-described embodiments and many variations can be made by any person ordinarily skilled in the field of the art of the present disclosure without departing from the technical ideas of the present disclosure. The components of the embodiments can be arbitrarily combined without departing from the gist of the present disclosure.

According to the present disclosure, in an input circuit, a delay time in an input buffer circuit can be reduced and an error that occurs in a pulse width of an output signal can be suppressed. Therefore, for example, the present disclosure is effective in increasing speed and performance of LSIs.

What is claimed is:

1. An input circuit that receives an input signal at an input terminal, the input circuit comprising:
    an input buffer circuit using a first node as an input and a second node as an output;
    an N-type transistor having a source coupled to the input terminal, a drain coupled to the first node, and a gate coupled to a power supply; and
    a pull-up circuit provided between the first node and the power supply,
    wherein
    the pull-up circuit is configured to make the power supply and the first node conductive with each other for a predetermined period when the input signal transitions from low to high and make the power supply and the first node non-conductive with each other after the predetermined period while the input signal remains high, and not to make the power supply and the first node conductive with each other when the input signal transitions from high to low, and
    the pull-up circuit includes:
        a NAND circuit configured to receive a signal of the first node as a first input, receive a signal of the second node as a second input when the input buffer circuit is an inverter, and receive an inversion signal of the signal of the second node as the second input when the input buffer circuit is a buffer that does not invert a logic of a signal, and
        a P-type transistor having a source coupled to the power supply and a drain coupled to the first node and receiving an output of the NAND circuit at a gate thereof.

2. The input circuit of claim 1, wherein
the input buffer circuit receives an enable signal and causes the signal of the first node to pass when the enable signal is a first logic level and not to pass when the enable signal is a second logic level, and
the pull-up circuit is configured not to make the power supply and the first node conductive with each other when the enable signal is the second logic level.

3. The input circuit of claim 1, further comprising:
a second N-type transistor having a drain coupled to the power supply, a source coupled to the first node, and a gate coupled to the input terminal.

4. An input circuit that receives an input signal at an input terminal, the input circuit comprising:
    an input buffer circuit using a first node as an input and a second node as an output;
    an N-type transistor having a source coupled to the input terminal, a drain coupled to the first node, and a gate coupled to a power supply; and
    a pull-up circuit provided between the first node and the power supply,
    wherein
    the pull-up circuit is configured to make the power supply and the first node conductive with each other for a predetermined period when the input signal transitions from low to high and make the power supply and the first node non-conductive with each other after the predetermined period while the input signal remains high, and not to make the power supply and the first node conductive with each other when the input signal transitions from high to low,
    the pull-up circuit includes first and second P-type transistors coupled in series between the power supply and the first node,
    the first P-type transistor receives an inversion signal of the signal of the first node at a gate thereof, and
    the second P-type transistor receives the signal of the second node at a gate thereof when the input buffer circuit is a buffer that does not invert a logic of a signal.

5. The input circuit of claim 4, wherein
the input buffer circuit receives an enable signal and causes the signal of the first node to pass when the enable signal is a first logic level and not to pass when the enable signal is a second logic level, and the pull-up circuit is configured not to make the power supply and the first node conductive with each other when the enable signal is the second logic level.

6. The input circuit of claim 4, further comprising:

a second N-type transistor having a drain coupled to the power supply, a source coupled to the first node, and a gate coupled to the input terminal.

7. An input circuit that receives an input signal at an input terminal, the input circuit comprising:

an input buffer circuit using a first node as an input and a second node as an output;

an N-type transistor having a source coupled to the input terminal, a drain coupled to the first node, and a gate coupled to a power supply; and a pull-up circuit provided between the first node and the power supply, wherein the pull-up circuit is configured to make the power supply and the first node conductive with each other for a predetermined period when the input signal transitions from low to high and make the power supply and the first node non-conductive with each other after the predetermined period while the input signal remains high, and not to make the power supply and the first node conductive with each other when the input signal transitions from high to low, the pull-up circuit includes first and second P-type transistors coupled in series between the power supply and the first node, the first P-type transistor receives an inversion signal of the signal of the first node at a gate thereof, and the second P-type transistor receives an inversion signal of the signal received by the gate of the first P-type transistor at a gate thereof.

8. The input circuit of claim 7, wherein the input buffer circuit receives an enable signal and causes the signal of the first node to pass when the enable signal is a first logic level and not to pass when the enable signal is a second logic level, and the pull-up circuit is configured not to make the power supply and the first node conductive with each other when the enable signal is the second logic level.

9. The input circuit of claim 7, further comprising:

a second N-type transistor having a drain coupled to the power supply, a source coupled to the first node, and a gate coupled to the input terminal.

10. An input circuit that receives an input signal at an input terminal, the input circuit comprising:

an input buffer circuit using a first node as an input and a second node as an output;

an N-type transistor having a source coupled to the input terminal, a drain coupled to the first node, and a gate coupled to a power supply; and a pull-up circuit provided between the first node and the power supply, wherein the pull-up circuit includes first and second P-type transistors coupled in series between the power supply and the first node, the first P-type transistor receives an inversion signal of a signal of the first node at a gate thereof, and the second P-type transistor receives a signal of the second node at a gate thereof when the input buffer circuit is a buffer that does not invert a logic of a signal.

11. The input circuit of claim 10, wherein the input buffer circuit receives an enable signal and causes the signal of the first node to pass when the enable signal is a first logic level and not to pass when the enable signal is a second logic level, the pull-up circuit includes a third P-type transistor coupled to the first and second P-type transistors in series, and the third P-type transistor receives a low signal at a gate thereof when the enable signal is the first logic level and receives a high signal at the gate when the enable signal is the second logic level.

12. The input circuit of claim 10, further comprising:

a second N-type transistor having a drain coupled to the power supply, a source coupled to the first node, and a gate coupled to the input terminal.

13. An input circuit that receives an input signal at an input terminal, the input circuit comprising:

an input buffer circuit using a first node as an input and a second node as an output;

an N-type transistor having a source coupled to the input terminal, a drain coupled to the first node, and a gate coupled to a power supply; and a pull-up circuit provided between the first node and the power supply, wherein the pull-up circuit is configured to make the power supply and the first node conductive with each other for a predetermined period when the input signal transitions from low to high and make the power supply and the first node non-conductive with each other after the predetermined period while the input signal remains high, and not to make the power supply and the first node conductive with each other when the input signal transitions from high to low, the pull-up circuit includes first and second P-type transistors coupled in series between the power supply and the first node, the first P-type transistor receives an inversion signal of the signal of the first node at a gate thereof, and the second P-type transistor receives an inversion signal of the signal of the second node at the gate when the input buffer circuit is an inverter.

14. An input circuit that receives an input signal at an input terminal, the input circuit comprising:

an input buffer circuit using a first node as an input and a second node as an output;

an N-type transistor having a source coupled to the input terminal, a drain coupled to the first node, and a gate coupled to a power supply; and a pull-up circuit provided between the first node and the power supply, wherein the pull-up circuit includes first and second P-type transistors coupled in series between the power supply and the first node, the first P-type transistor receives an inversion signal of a signal of the first node at a gate thereof, and the second P-type transistor receives an inversion signal of the signal of the second node at the gate when the input buffer circuit is an inverter.

15. The input circuit of claim 14, wherein the input buffer circuit receives an enable signal and causes the signal of the first node to pass when the enable signal is a first logic level and not to pass when the enable signal is a second logic level, the pull-up circuit includes a third P-type transistor coupled to the first and second P-type transistors in series, and the third P-type transistor receives a low signal at a gate thereof when the enable signal is the first logic level and receives a high signal at the gate when the enable signal is the second logic level.

16. The input circuit of claim 14, further comprising:

a second N-type transistor having a drain coupled to the power supply, a source coupled to the first node, and a gate coupled to the input terminal.

* * * * *